(12) United States Patent　　(10) Patent No.:　　US 7,776,247 B2
Watanabe et al.　　(45) Date of Patent:　　Aug. 17, 2010

(54) METHOD OF MANUFACTURING ELECTRONIC DEVICE HAVING RESIN-MOLDED CASE AND MOLDING TOOL FOR FORMING RESIN-MOLDED CASE

(75) Inventors: Tatsuya Watanabe, Anjo (JP);
Masahiko Imoto, Kariya (JP);
Yoshinari Goshima, Toyohashi (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/156,518

(22) Filed: Jun. 2, 2008

(65) Prior Publication Data

US 2008/0296796 A1　　Dec. 4, 2008

(30) Foreign Application Priority Data

Jun. 4, 2007　　(JP)　　.............................. 2007-148368

(51) Int. Cl.
　　*B29C 45/14*　　(2006.01)
(52) U.S. Cl. ............................. 264/272.11; 264/272.14; 264/272.15
(58) Field of Classification Search ............ 264/272.11, 264/272.15, 272.14
See application file for complete search history.

(56) References Cited

U.S. PATENT DOCUMENTS 6,527,989 B1 * 3/2003 Onoda ....................... 264/40.1

2006/0171127 A1 * 8/2006 Kadoya et al. .............. 361/752

FOREIGN PATENT DOCUMENTS

| GB | 2424613 A | 10/2006 |
|---|---|---|
| JP | 01-158756 | 6/1989 |
| JP | 04-330741 | 11/1992 |
| JP | 05-021492 | 1/1993 |
| JP | 11-254477 | 9/1999 |

OTHER PUBLICATIONS

Office Action issued in the corresponding JP Application No. 2007-148368 mailed Apr. 14, 2009 with English translation.
Office action dated Nov. 27, 2009 in corresponding Chinese application No. 2008 100983680.

* cited by examiner

*Primary Examiner*—Philip C Tucker
*Assistant Examiner*—Alison Hindenlang
(74) *Attorney, Agent, or Firm*—Harness, Dickey & Pierce, PLC

(57) ABSTRACT

In a method of manufacturing an electronic device, an electronic element is disposed on a wiring plate that is electrically coupled with a connector terminal, a first surface of the wiring plate is covered with a first casing element and a second surface of the wiring plate is covered with a second casing element to form an electronic circuit part, the electronic circuit part is disposed in a case cavity of a molding tool, and a resin is filled into the case cavity to form the resin-molded case while keeping a state where a first pressure that pushes the first casing element toward the wiring plate and that changes with time is substantially equal to a second pressure that pushes the second casing element toward the wiring plate and that changes with time.

13 Claims, 18 Drawing Sheets

FRONT SIDE ←→ REAR SIDE

FRONT SIDE ⟷ REAR SIDE

METHOD OF MANUFACTURING ELECTRONIC DEVICE HAVING RESIN-MOLDED CASE AND MOLDING TOOL FOR FORMING RESIN-MOLDED CASE

CROSS REFERENCE TO RELATED APPLICATION

The present application is based on and claims priority to Japanese Patent Application No. 2007-148368 filed on Jun. 4, 2007, the contents of which are incorporated in their entirety herein by reference.

BACKGROUND OF THE INVENTION

1. Field of the Invention

The present invention relates to a method of manufacturing an electronic device having a molded resin case and a molding tool for forming the resin-molded case.

2. Description of the Related Art

JP-5-21492A discloses a hybrid integrated circuit (hybrid IC) that includes a hybrid IC board and a resin film for sealing the hybrid IC board. The resin film is formed using a molding tool including an upper molding element and a lower molding element. The lower molding element includes a plurality of holding parts protruding to a molding space from a lower portion thereof. The holding parts are movable in an up-and-down direction. The hybrid IC board includes a lead wire. The hybrid IC is disposed on the holding parts while the lead wire is inserted into a receiving groove. Then, melted resin is filled into the molding space through an introducing passage and a submarine gate. When a most of the molding space is filled with the melted resin, the holding parts move downward. Then, the molded resin is further filled into the molding space while applying a predetermined pressure. In this way, the resin film for sealing the hybrid IC board is formed.

When electronic elements mounted on the hybrid IC board are directly sealed by the resin, the electronic elements or a connecting portion between the electronic elements and the hybrid IC board may be damaged depending on a property of the resin. For example, stress or thermal stress is applied to the hybrid IC when the resin film is formed. Thus, the electronic elements mounted on the hybrid IC are housed in a circuit casing, and the circuit casing is sealed with resin. However, when the melted resin is filled into the molding space, the hybrid IC board and the circuit casing receive a filling pressure. Thereby, the hybrid IC board may deform and a clearance is provided between the hybrid IC and the circuit casing. In the present case, the electronic elements cannot be sealed by the circuit casing. Thus, an additional process, for example, an adhesion process is required for fixing the circuit casing to the hybrid IC board.

SUMMARY OF THE INVENTION

In view of the foregoing problems, it is an object of the present invention to provide a method of manufacturing an electronic device having a resin-molded case and a molding tool for forming the resin-molded case.

According to a first aspect of the invention, a method of manufacturing an electronic device includes: disposing an electronic element on a wiring plate that is electrically coupled with a connector terminal; covering a first surface of the wiring plate with a first casing element and covering a second surface of the wiring plate with a second casing element to form the electronic circuit part; disposing the electronic circuit part in a case cavity of a molding tool in such a manner that an end portion of the connector terminal protrudes to an outside of the case cavity; and filling resin into the case cavity of the molding tool to form the resin-molded case while keeping a state where a first pressure that pushes the first casing element toward the wiring plate and that changes with time is substantially equal to a second pressure that pushes the second casing element toward the wiring plate and that changes with time.

In the present manufacturing method, the first casing element and the second casing element can seal the electronic element by using the first pressure and the second pressure. Thus, an additional process for sealing the electronic element is not required.

According to a second aspect of the invention, a method of manufacturing an electronic device includes: disposing an electronic element on a wiring plate that is electrically coupled with a connector terminal; covering a first surface of the wiring plate with a first casing element and covering a second surface of the wiring plate with a second casing element to form the electronic circuit part, in which at least one of the first casing element and the second casing element has a wall portion that is disposed along a whole circumference of an outer end of a surface of the one of the first casing element and the second casing element and that protrudes toward the wiring plate; disposing the electronic circuit part in a case cavity of a molding tool in such a manner that an end portion of the connector terminal protrudes to an outside of the case cavity; and filling resin into that case cavity to form the resin-mold case so that the first casing element and the second casing element are pushed toward the wiring plate by the filled resin and the wall portion contacts the wiring plate and deforms.

In the present manufacturing method, the first casing element and the second casing element can seal the electronic element when pushed by the filled resin. Thus, an additional process for sealing the electronic element is not required.

According to a third aspect of the invention, a molding tool of manufacturing a resin-molded case for sealing an electronic circuit part is provided. The electronic circuit part includes an electronic element, a wiring plate for wiring the electronic element, a connector terminal electrically coupled with the wiring plate, a first casing element for covering a first surface of the wiring plate, and a second casing element for covering a second surface of the wiring plate. The molding tool includes a case cavity and a supplying passage. The case cavity is configured to form the resin-molded case and that is configured to house the electronic circuit part in such a manner that an end portion of the connector terminal protrudes to an outside of the case cavity. The supplying passage is configured to introduce a resin into the case cavity and that has an opening portion communicated with the case cavity. A position of the opening portion is determined in such a manner that a first pressure that pushes the first casing element toward the wiring plate and that changes with time is kept to be substantially equal to a second pressure that pushes the second casing element toward the wiring plate and that changes with time during the resin is filled into the case cavity from the opening portion.

When the resin-molded case is formed by using the present molding tool, the first casing element and the second casing element can seal the electronic element by using the first pressure and the second pressure. Thus, an additional process for sealing the electronic element is not required.

BRIEF DESCRIPTION OF THE DRAWINGS

Additional objects and advantages of the present invention will be more readily apparent from the following detailed description of preferred embodiments when taken together with the accompanying drawings. In the drawings.

DETAILED DESCRIPTION OF THE PREFERRED EMBODIMENTS

First Embodiment

Figure 1:
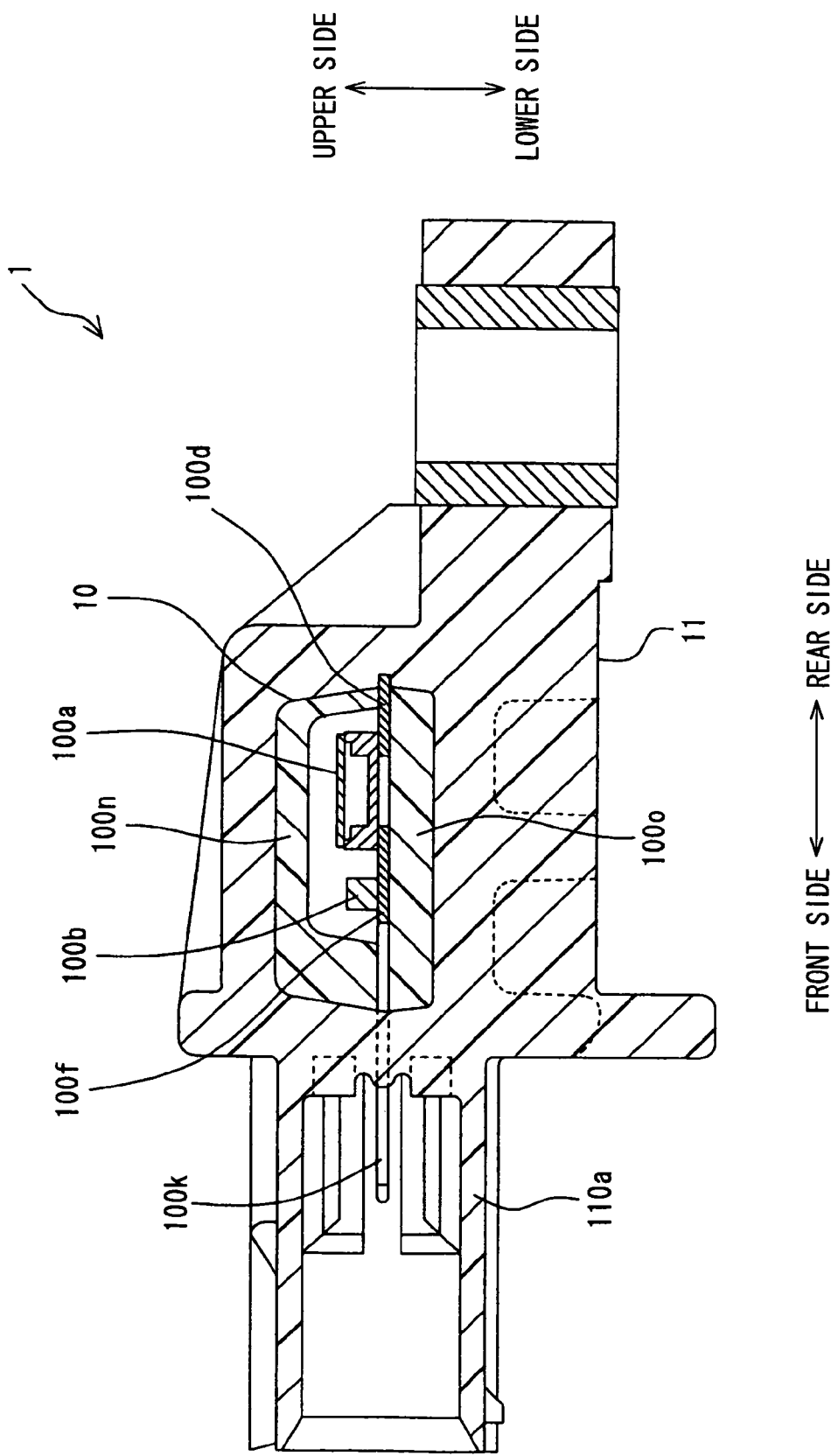
FIG. 1 is a cross-sectional view showing an acceleration sensor according to a first embodiment of the invention.
Figure 2:
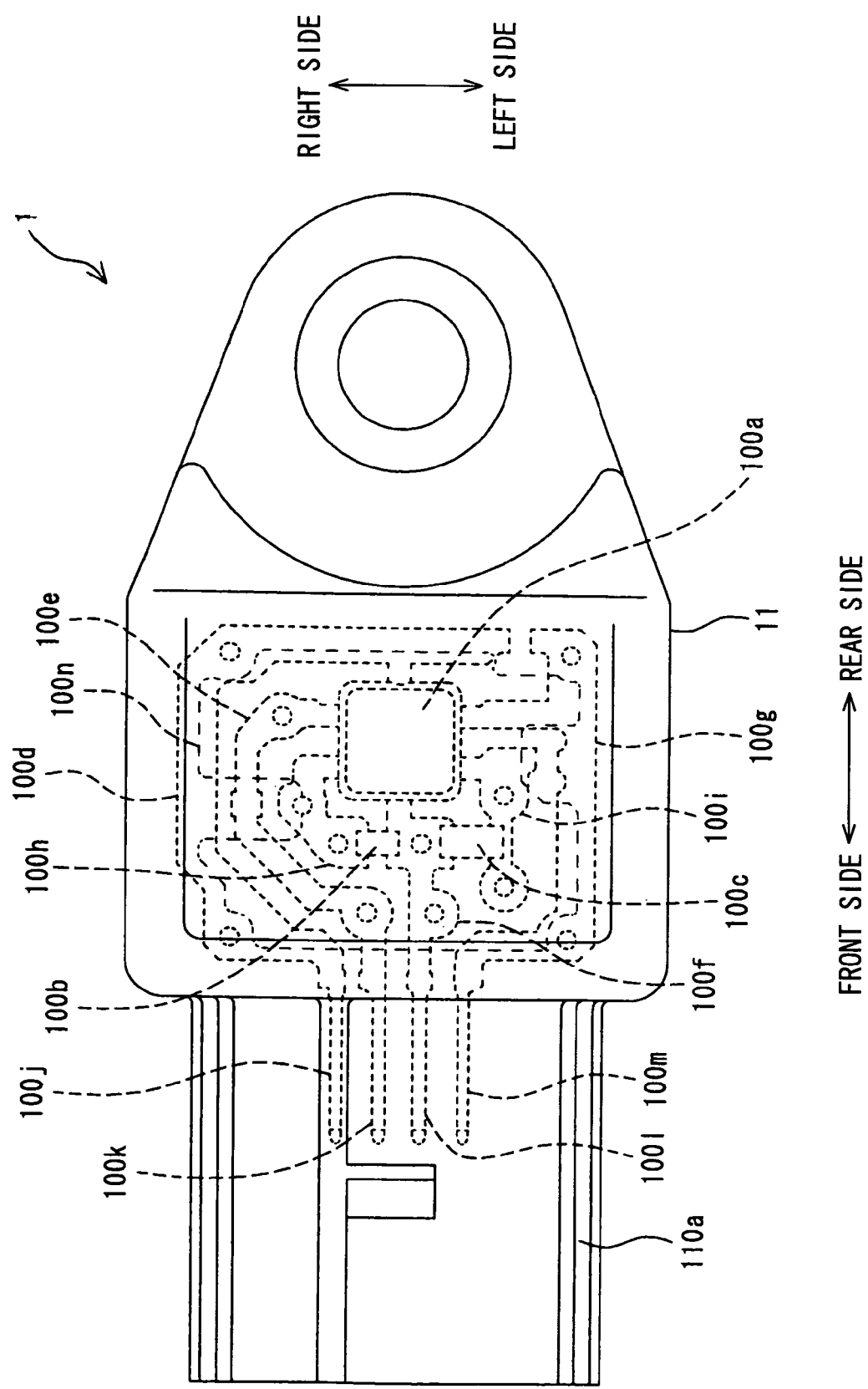
FIG. 2 is a top view showing the acceleration sensor according to the first embodiment.
Figure 3:
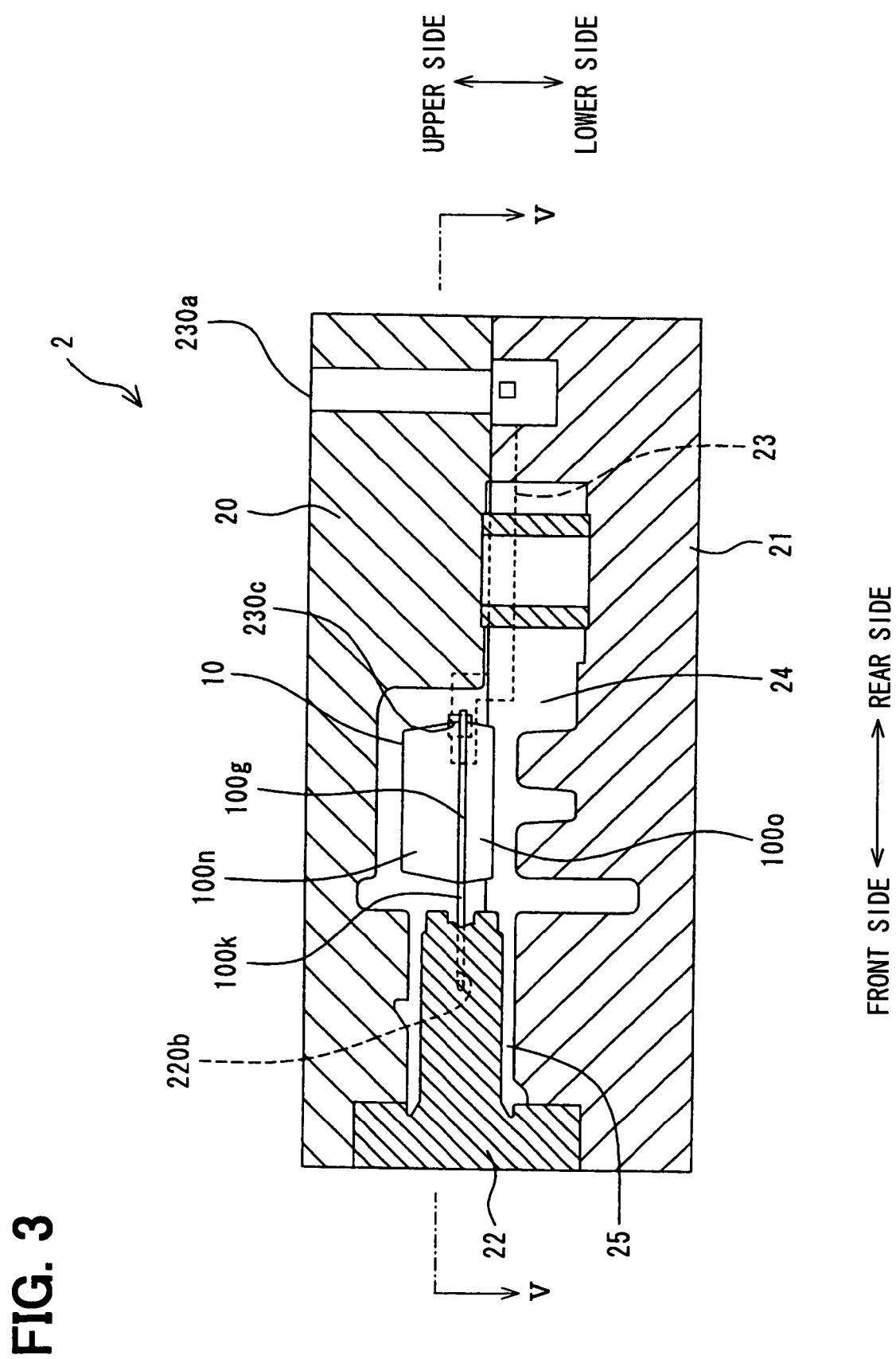
FIG. 3 is a cross-sectional view showing a molding tool according to the first embodiment.

In FIGS. 1-3, an electronic device according to a first embodiment of the invention is shown as used for an acceleration sensor 1 for a vehicle, for example. In FIGS. 1-3, directions of a front side, a rear side, an upper side, a lower side, a right side, and a left side are shown as a matter of convenience for describing an exemplary structure of the acceleration sensor 1.

As shown in FIGS. 1 and 2, the acceleration sensor 1 includes an electronic circuit part 10 and a resin-molded case 11. The electronic circuit part 10 detects acceleration in a predetermined direction, converts the acceleration into a corresponding signal, and outputs the signal. The electronic circuit part 10 includes an acceleration sensor element 100a, capacitors 100b and 100c, wiring metal plates 100d-100i, connector terminals 100j-100m, an upper casing element 100n, and a lower casing element 100o. In the present embodiment, the acceleration sensor element 100a and the capacitors 100b and 100c correspond to electronic elements, the wiring metal plates 100d-100i correspond to a wiring plate, the upper casing element 100n corresponds to a first casing element, and the lower casing element 100o corresponds to a second casing element.

The acceleration sensor element 100a detects the acceleration in the predetermined direction and outputs the signal in accordance with the acceleration. The capacitors 100b and 100c operate the acceleration sensor element 100a. The wiring metal plates 100d-100i are configured to wire the acceleration sensor element 100a and the capacitors 100b and 100c. The wiring metal plates 100d-100i have plate shape and are made of metal. The acceleration sensor element 100a is soldered on upper surfaces of the wiring metal plates 100d-100i. The capacitor 100b is soldered on the upper surfaces of the wiring metal plates 100f and 100h. The capacitor 100c is soldered on the upper surfaces of the wiring metal plates 100f and 100i.

The connector terminals 100j-100m have predetermined shape for coupling a circuit that includes the acceleration sensor element 100a and the capacitors 100b and 100c with an external device. The connector terminals 100j-100m are made of metal. The connector terminals 100j-100m are integrally formed with the wiring metal plates 100d-100g at end portions of the wiring metal plates 100d-100g, respectively.

The upper casing element 100n has an approximately tubular shape with a bottom surface. The upper casing element 100n covers the upper surfaces of the wiring metal plates 100d-100i at which the acceleration sensor element 100a and the capacitors 100b and 100c are soldered. A lower end surface of the upper casing element 100n has a plane shape.

The lower casing element 100o has an approximately tubular shape with a bottom surface. The lower casing element 100o covers lower sides of the wiring metal plates 100d-100i. An upper end surface of the lower casing element 100o has a plane shape. The acceleration sensor element 100a and the capacitors 100b and 100c are sealed with the upper casing element 100n and the lower casing element 100o.

The resin-molded case 11 seals the electronic circuit part 10 in such a manner that end portions of the connecter terminals 100j-100m protrude to an outside of the resin-molded case 11. At a front-end surface of the resin-molded case 11, a connector housing 110a is integrally formed. The connector housing 110a has an approximately elliptic tubular shape and surrounds the protruding end portions of the connector terminals 100j-100m.

A molding tool 2 for forming the resin-molded case 11 and a method of manufacturing the resin-molded case 11 will now be described with reference to FIGS. 3-7. In FIGS. 3-7, directions of a front side, a rear side, an upper side, a lower side, a right side, and a left side are shown as a matter of convenience for describing an exemplary structure of the molding tool 2.

Figure 4:
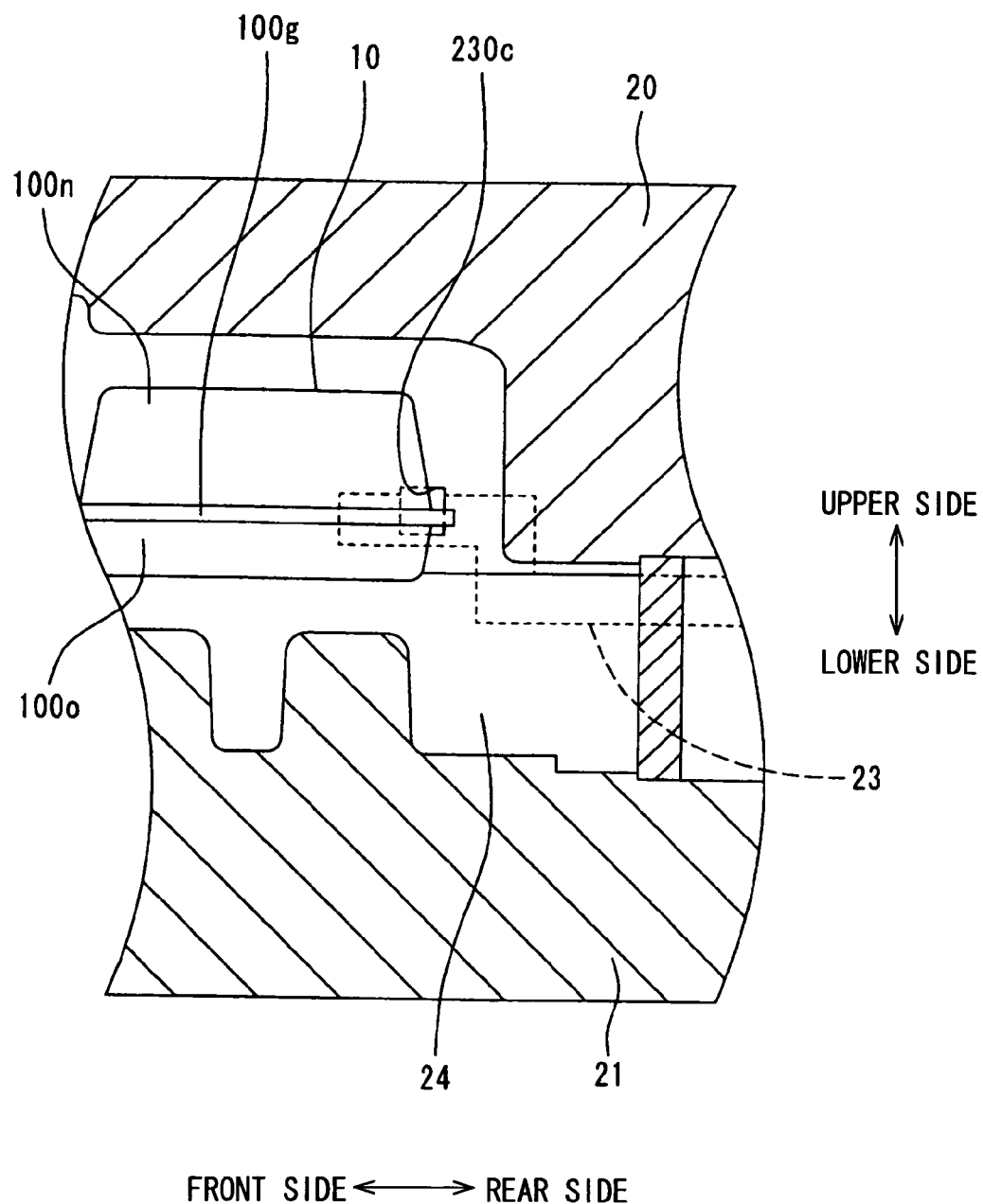
FIG. 4 is an enlarged cross-sectional view showing a part of the molding tool adjacent to an opening portion of a supplying passage.
Figure 5:
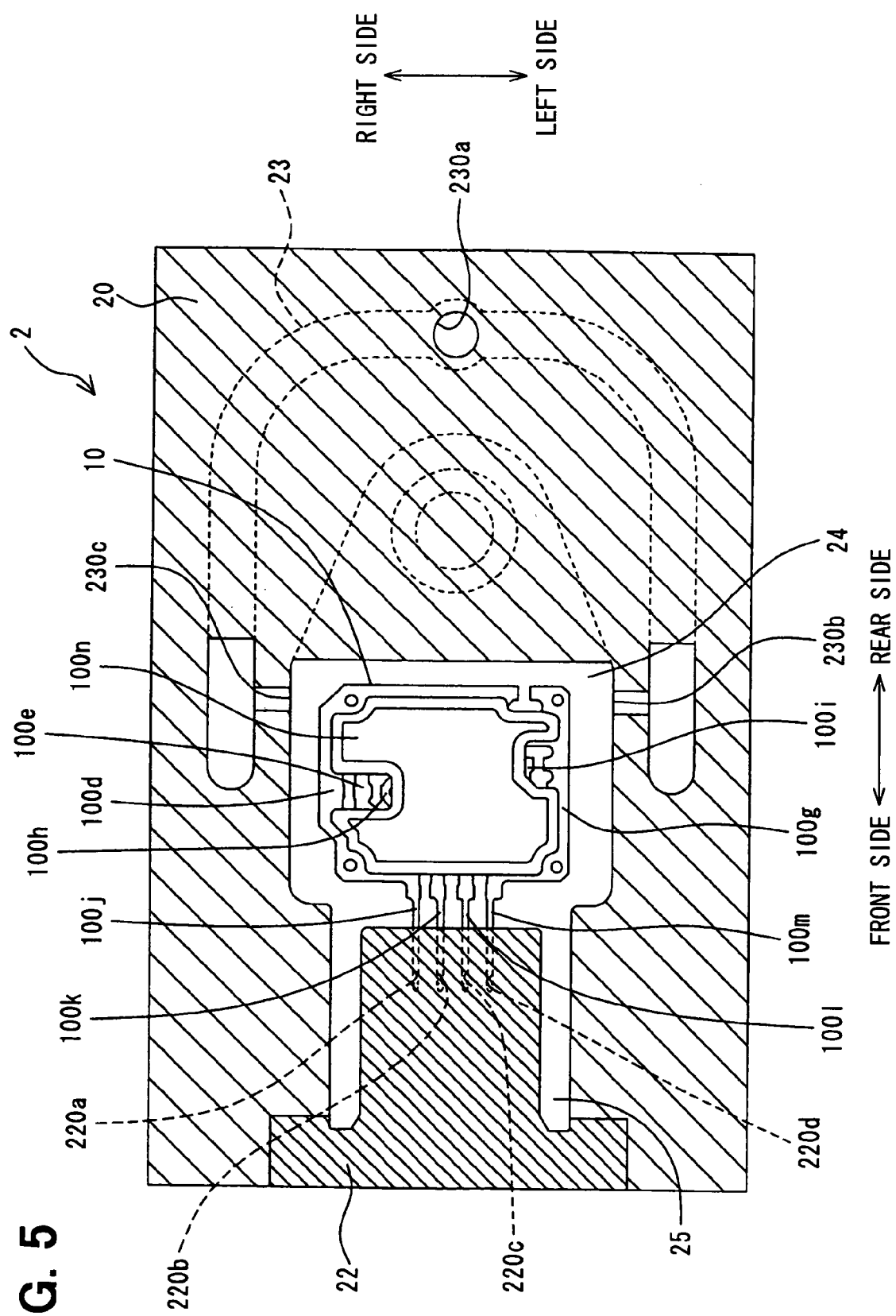
FIG. 5 is a cross-sectional view showing the molding tool taken along line V-V in FIG. 3.

As shown in FIGS. 3-5, the molding tool 2 includes an upper molding element 20, a lower molding element 21, a slide core 22, and a supplying passage 23. The upper molding element 20 is configured to form an upper part of the resin-molded case 11. The lower molding element 21 is configured to form a lower part of the resin-molded case 11. The slide core 22 is configured to form a front-end surface of the resin-molded case 11 and an inner peripheral surface of the connector housing 110a. At a rear portion of the slide core 22, inserting holes 220a-220d extending to the front side are provided. The connector terminals 100j-100m are inserted into the inserting holes 220a-220d, respectively.

The upper molding element 20, the lower molding element 21, and the slide core 22 define a case cavity 24 at a center portion thereof. The case cavity 24 is provided for forming the resin-molded case 11. At a front portion of the case cavity 24, a housing cavity 25 is provided for forming the connector housing 110a. The housing cavity 25 has an approximately elliptic tubular shape and one end of the housing cavity 25 is communicated with the case cavity 24.

The supplying passage 23 is provided for introducing melted resin 3 from an outside of the molding tool 2 to the case cavity 24 and the housing cavity 25. One opening portion 230a of the supplying passage 23 is provided at an upper surface of the upper molding element 20, as shown in FIG. 3. The other opening portions 230b and 230c of the supplying passage 23 are provided at a right side and a left side of an inner surface for defining the case cavity 24, as shown in FIG. 5. The opening portions 230b and 230c are opposed to each other.

The electronic circuit part 10 is disposed in the case cavity 24 in such a manner that the connector terminals 100j-100m are inserted into the inserting holes 220a-220d, respectively.

Figure 6:
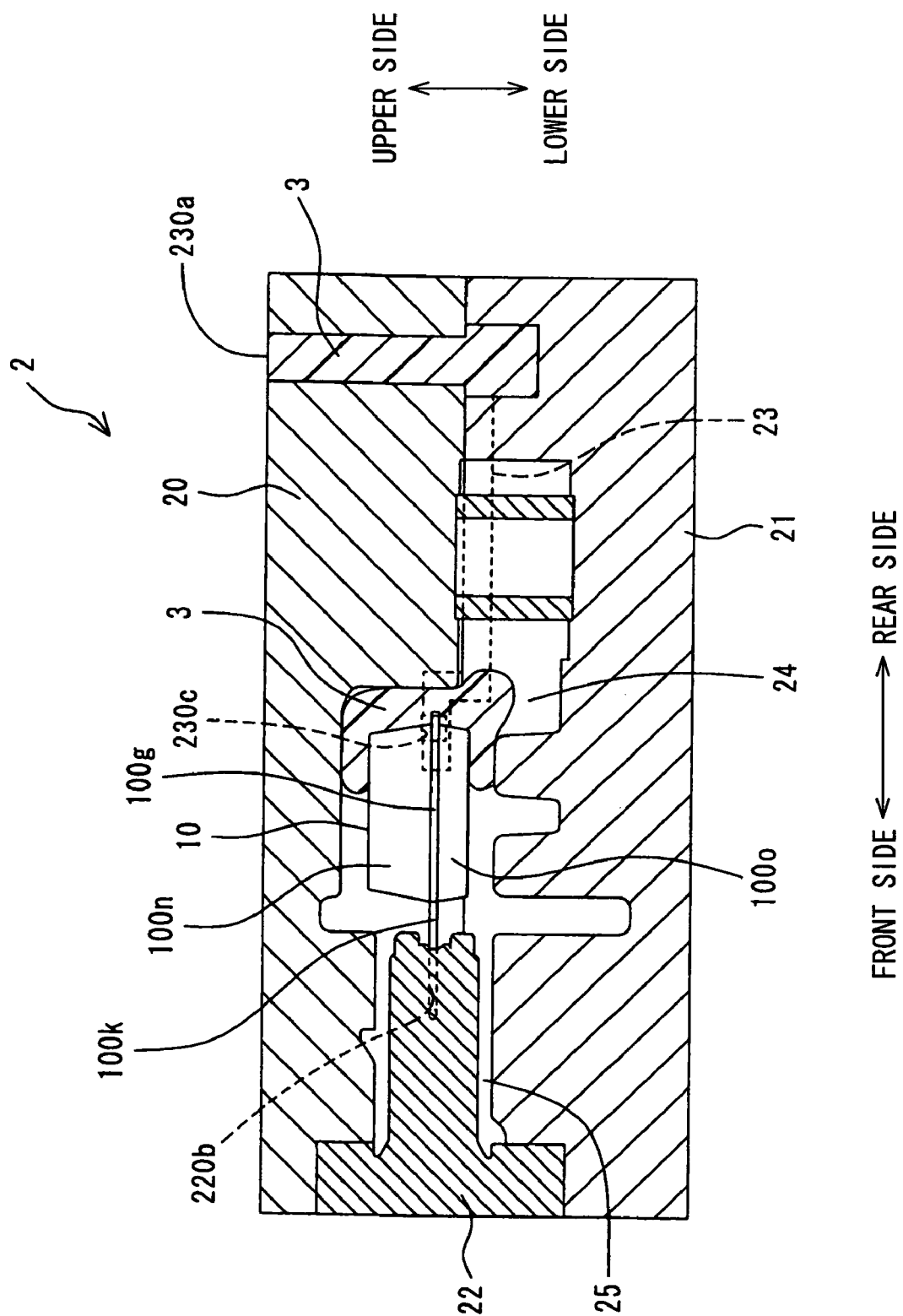
FIG. 6 is a cross-sectional view showing the molding tool according to the first embodiment in a state where resin is filled.
Figure 7:
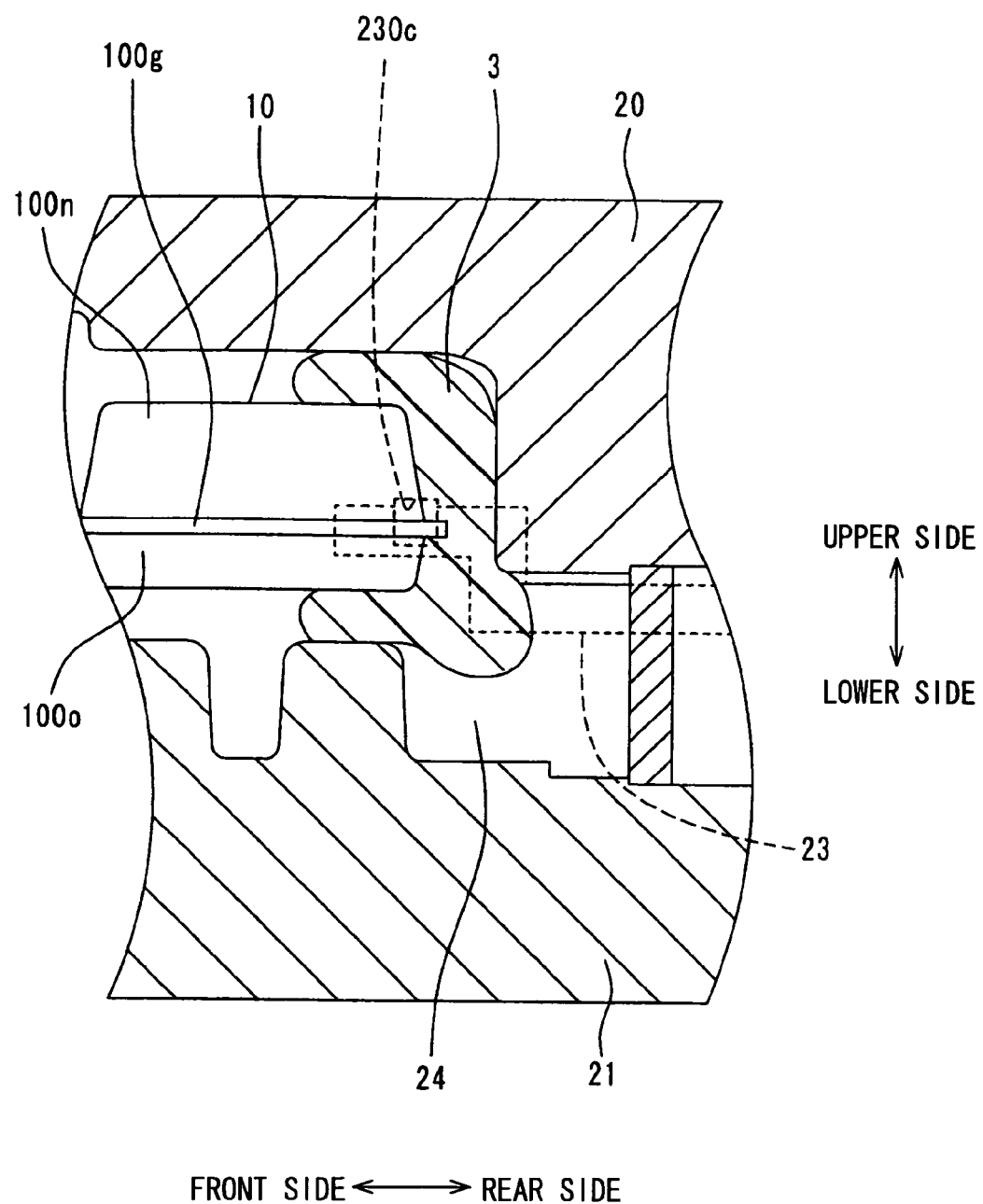
FIG. 7 is an enlarged cross-sectional view showing the part of the molding tool adjacent to the opening portion of the supplying passage according to the first embodiment.

As shown in FIGS. 6 and 7, the melted resin 3 is filled into the case cavity 24 through the supplying passage 23. In addition, the melted resin 3 is filled into the housing cavity 25 through the case cavity 24. When the melted resin 3 is filled into the case cavity 24, filling pressure is applied to the electronic circuit part 10. The filling pressure includes a first pressure that pushes the upper casing element 100n toward the wiring metal plates 100d-100i and a second pressure that pushes the lower casing element 100o toward the wiring metal plates 100d-100i. In the present case, the first pressure and the second pressure are generated by the melted resin 3 filled into the case cavity 24 and change with time.

Positions of the opening portions 230b and 230c of the supplying passage 23 are determined in such a manner that the first pressure is kept to be substantially equal to the second pressure during the melted resin 3 is filled into the case cavity 24. Specifically, the positions of the opening portions 230b and 230c are determined in such a manner that an area of the upper casing element 100n that is covered by the melted resin 3 and that changes with time is kept to be substantially equal to an area of the lower casing element 100o that is covered by the melted resin 3 and that changes with time during the melted resin 3 is filled into the case cavity 24. For example, the opening portions 230b and 230c are provided at portions that are adjacent to a rear end of the electronic circuit part 10 and that are adjacent to the wiring metal plates 100d-100i.

If the first pressure pushing the upper casing element 100n toward the wiring metal plates 100d-100i and the second pressure pushing the lower casing element 100o toward the wiring metal plates 100d-100i are uneven, the wiring metal plates 100d-100i may deform and a clearance may be provided between the wiring metal plates 100d-100i and the upper casing element 100n and the lower casing element 100o. However, in the molding tool 2, the opening portions 230b and 230c are determined in such a manner that the upper casing element 100n and the lower casing element 100o are pushed with substantially equal pressures toward the wiring metal plates 100d-100i. Thus, the wiring metal plates 100d-100i are restricted from deforming. Furthermore, the upper casing element 100n, the lower casing element 100o, and the wiring metal plates 100d-100i can be attached firmly to each other. Thus, the upper casing element 100n and the lower casing element 100o can seal the acceleration sensor element 100a and the capacitors 100b and 100c. In addition, because the upper casing element 100n and the lower casing element 100o seal the acceleration sensor element 100a and the capacitors 100b and 100c by using the filling pressure of the melted resin 3, an additional process, for example, an adhesion process is not required.

As a result, in the above-described method, the upper casing element 100n and the lower casing element 100o can seal the acceleration sensor element 100a and the capacitors 100b and 100c without an additional process.

Second Embodiment

Figure 8:
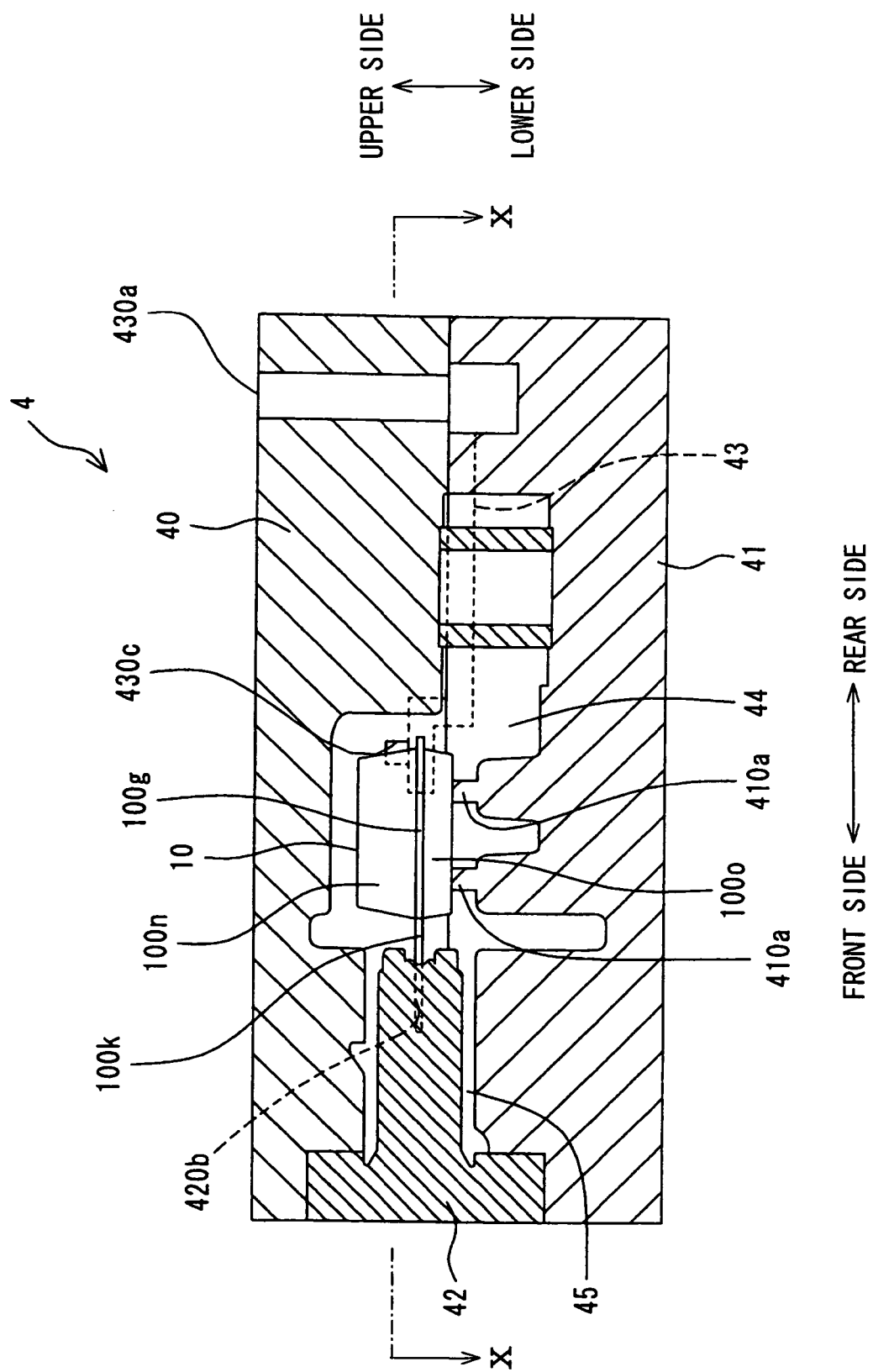
FIG. 8 is a cross-sectional view showing a molding tool according to a second embodiment of the invention.
Figure 9:
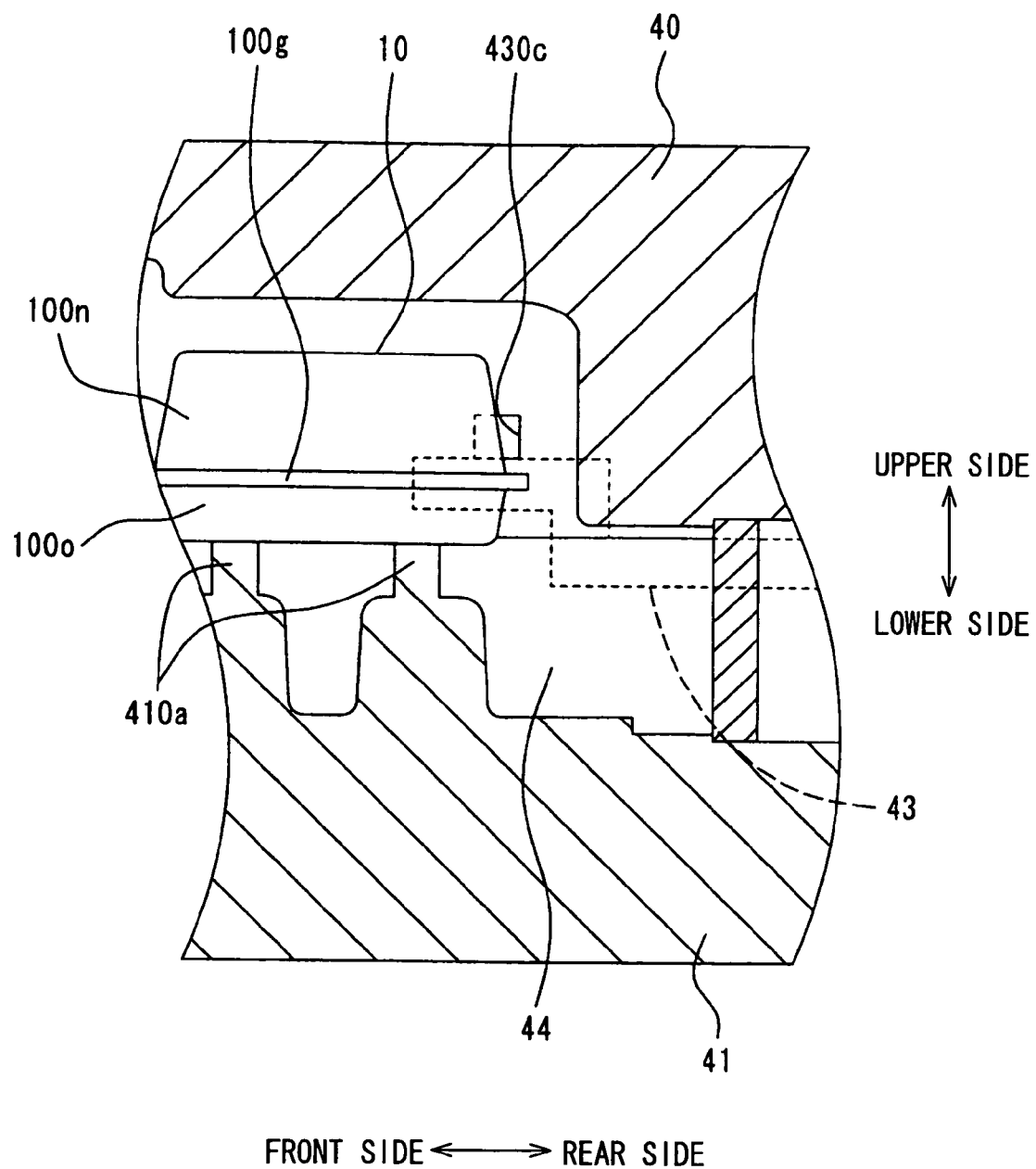
FIG. 9 is an enlarged cross-sectional view showing a part of the molding tool adjacent to an opening portion of a supplying passage according to the second embodiment.
Figure 10:
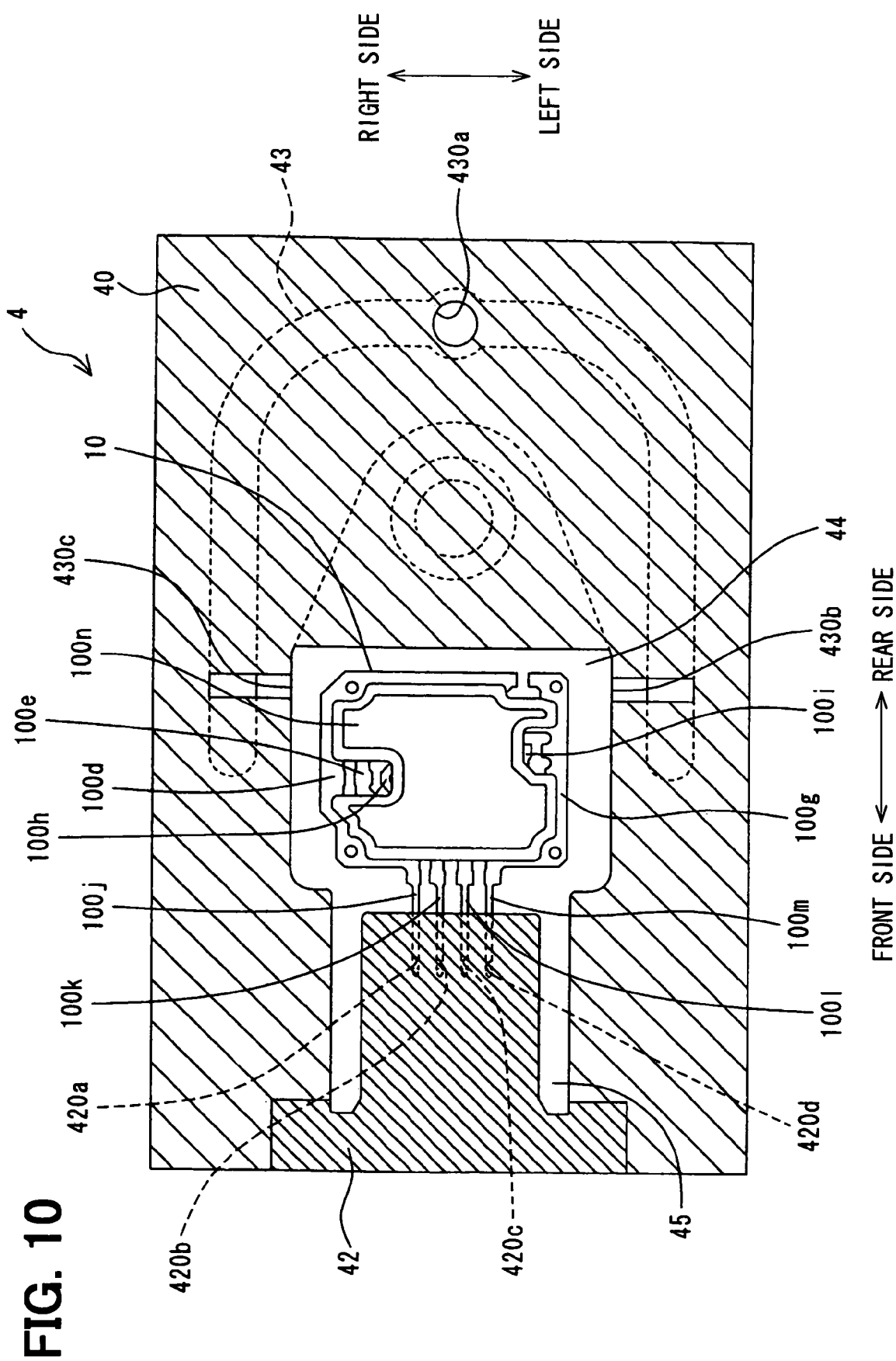
FIG. 10 is a cross-sectional view showing the molding tool taken along line X-X in FIG. 8.

A molding tool 4 according to a second embodiment of the invention will be described with reference to FIGS. 8-12. The molding tool 4 includes an upper molding element 40, a lower molding element 41, a slide core 42, and a supplying passage 43. The lower molding element 41 includes a plurality of holding parts 410a. The holding parts 410a protrude upward from an upper surface of the lower molding element 41 for holding the lower casing element 100o. One opening portion 430a of the supplying passage 43 is provided at an upper surface of the upper molding element 40, as shown in FIG. 8. The other opening portions 430b and 430c of the supplying passage 43 are provided at a right side and a left side of an inner peripheral surface for defining a case cavity 44, as shown in FIG. 10. The opening portions 430b and 430c are opposed to each other.

The electronic circuit part 10 is disposed in the case cavity 44 in such a manner that the connector terminals 100j-100m are inserted into inserting holes 420a-420d provided at a rear portion of the slide core 42. In addition, upper end surfaces of the holding parts 410a contact the lower casing element 100o, and thereby the electronic circuit part 10 is held by the holding parts 410a.

Figure 11:
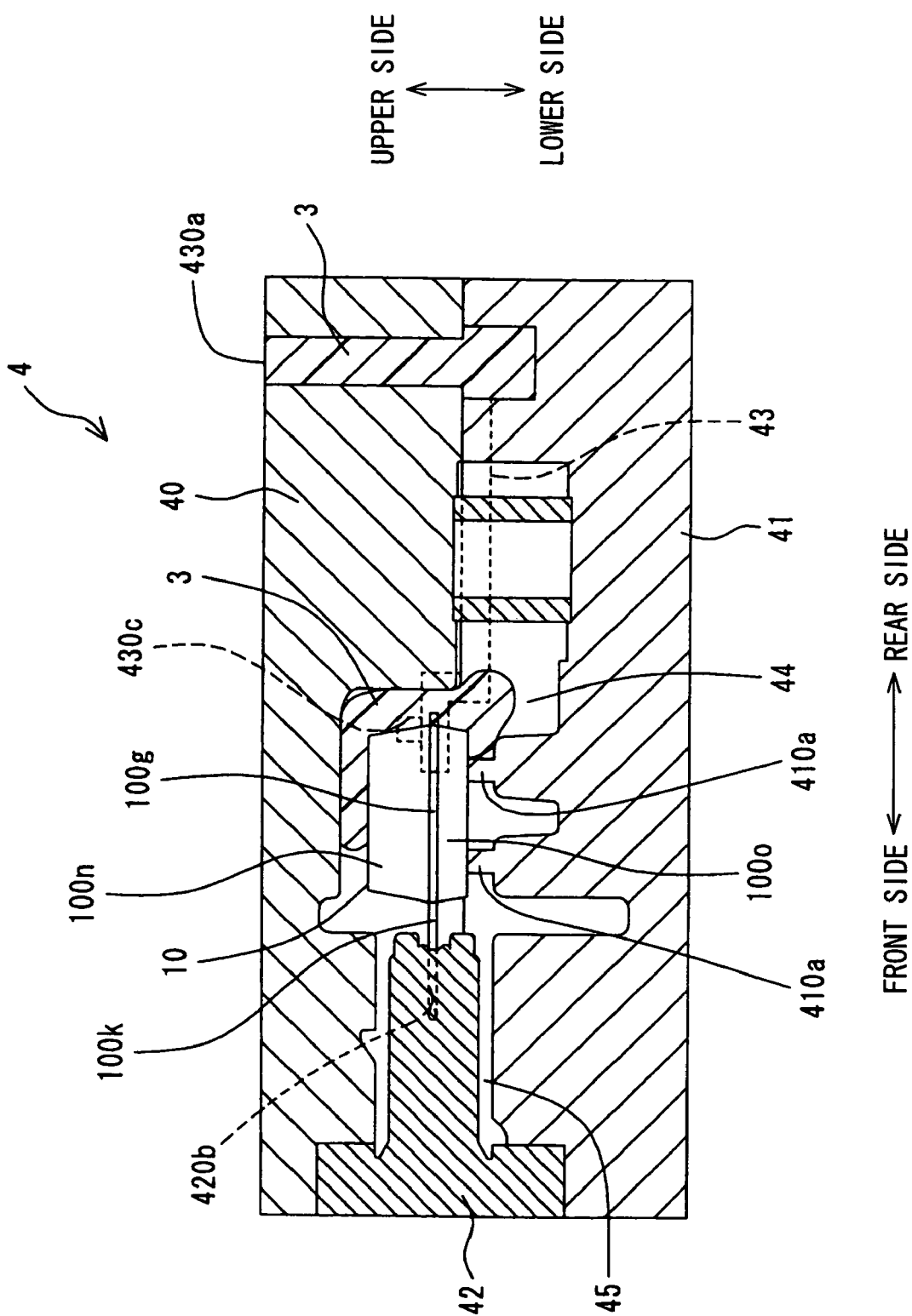
FIG. 11 is a cross-sectional view showing the molding tool according to the second embodiment in a state where resin is filled.
Figure 12:
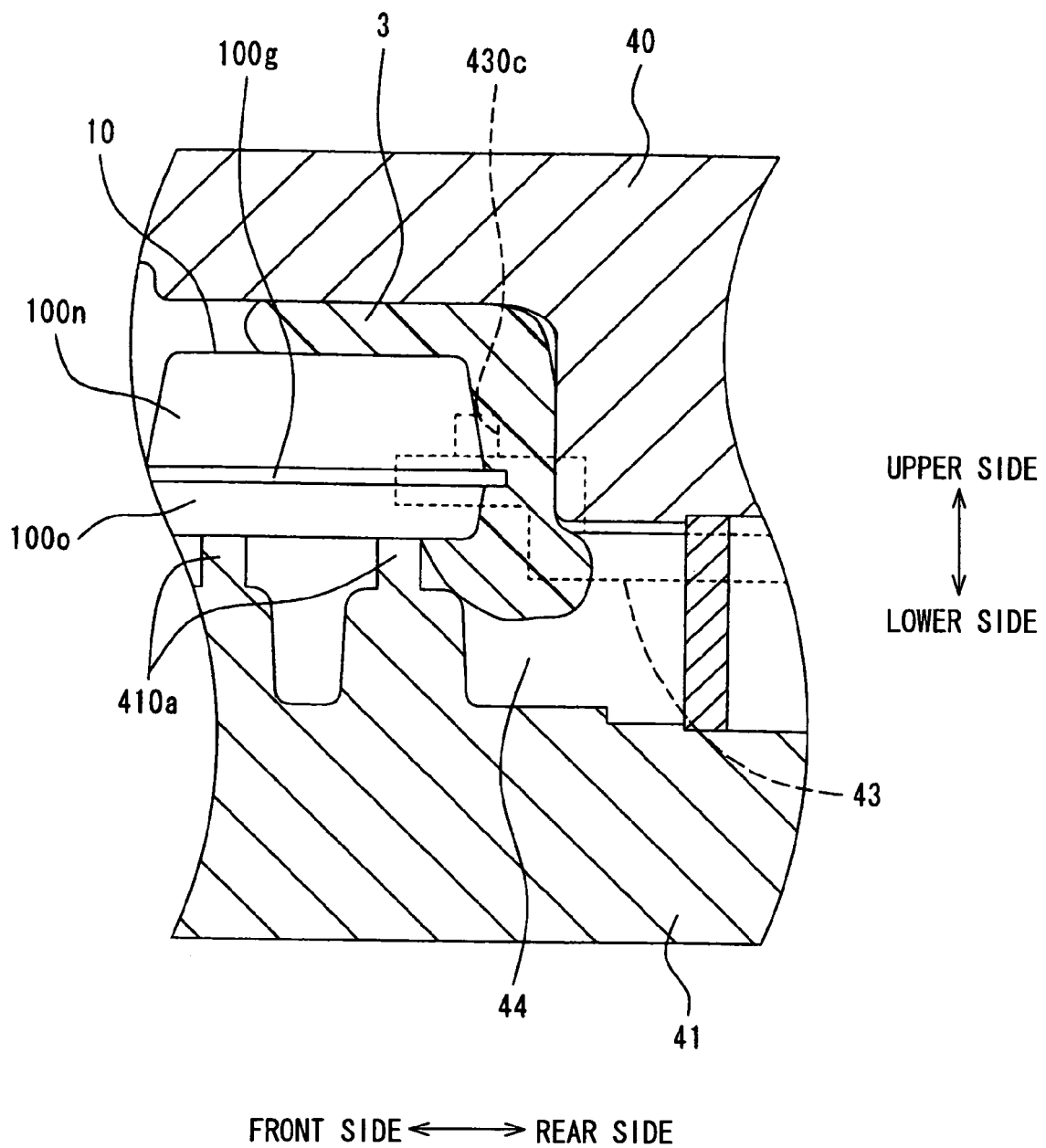
FIG. 12 is an enlarged cross-sectional view showing the part of the molding tool adjacent to the opening portion of the resin-supplying passage according to the second embodiment.

As shown in FIGS. 11 and 12, melted resin 3 is filled into the case cavity 44 through the supplying passage 43. In addition, the melted resin 3 is filled into a housing cavity 45 through the case cavity 44. When the melted resin 3 is filled into the case cavity 44, filling pressure is applied to the electronic circuit part 10. The filling pressure depends on the melted resin 3 filled into the case cavity 44 and changes with time. The filling pressure includes a first pressure that pushes the upper casing element 100n toward the wiring metal plates 100d-100i, and a second pressure that pushes the lower casing element 100o toward the wiring metal plates 100d-100i.

In the molding tool 4, the lower casing element 100o is held by the holding parts 410a from a lower side thereof. Thus, when the upper casing element 100n is pushed toward the wiring metal plates 100d-100i with a predetermined pressure, the lower casing element 100o is also pushed toward the wiring metal plates 100d-100i with a pressure similar to the predetermined pressure by the holding parts 410a. Thus, the first pressure and a part of the second pressure are generated by the melted resin 3, and the other part of the second pressure is provided by the holding parts 410a.

Positions of the opening portions 430b and 430c of the supplying passage 43 are determined in such a manner that the part of the second pressure generated by the melted resin 3 is kept to be smaller than the first pressure. Specifically, the positions of the opening portions 430b and 430c are determined in such a manner that an area of the lower casing element 100o that is covered by the melted resin 3 and that changes with time is kept to be smaller than an area of the upper casing element 100n that is covered by the melted resin 3 and that changes with time during the melted resin 3 is filled. For example, the opening portions 430b and 430c are provided at portions that are adjacent to the rear end of the electronic circuit part 10 and that are located on an upper side with respect to the wiring metal plates 100d-100i, as shown in FIG. 9.

Thereby, the first pressure that pushes the upper casing element 100n toward the wiring metal plates 100d-100i is kept to be substantially equal to the whole second pressure that pushes the lower casing element 100o toward the wiring metal plates 100d-100i. Thus, the upper casing element 100n and the lower casing element 100o are pushed with substantially equal pressures toward the wiring metal plates 100d-100i. As a result, the wiring metal plates 100d-100i are restricted from deforming. Furthermore, the upper casing element 100n, the lower casing element 100o, and the wiring metal plates 100d-100i can be attached firmly to each other. Thus, the upper casing element 100n and the lower casing element 100o can seal the acceleration sensor element 100a and the capacitors 100b and 100c. In addition, because the upper casing element 100n and the lower casing element 100o seal the acceleration sensor element 100a and the capacitors 100b and 100c by using the filling pressure of the melted resin 3, an additional process, for example, an adhesion process is not required.

As a result, in the present method, the upper casing element 100n and the lower casing element 100o can seal the acceleration sensor element 100a and the capacitors 100b and 100c without an additional process. In addition, the lower casing element 100o can be stably held by the holding parts 410a. Thus, a uniform pressure can be applied to the lower casing element 100o.

Figure 13:
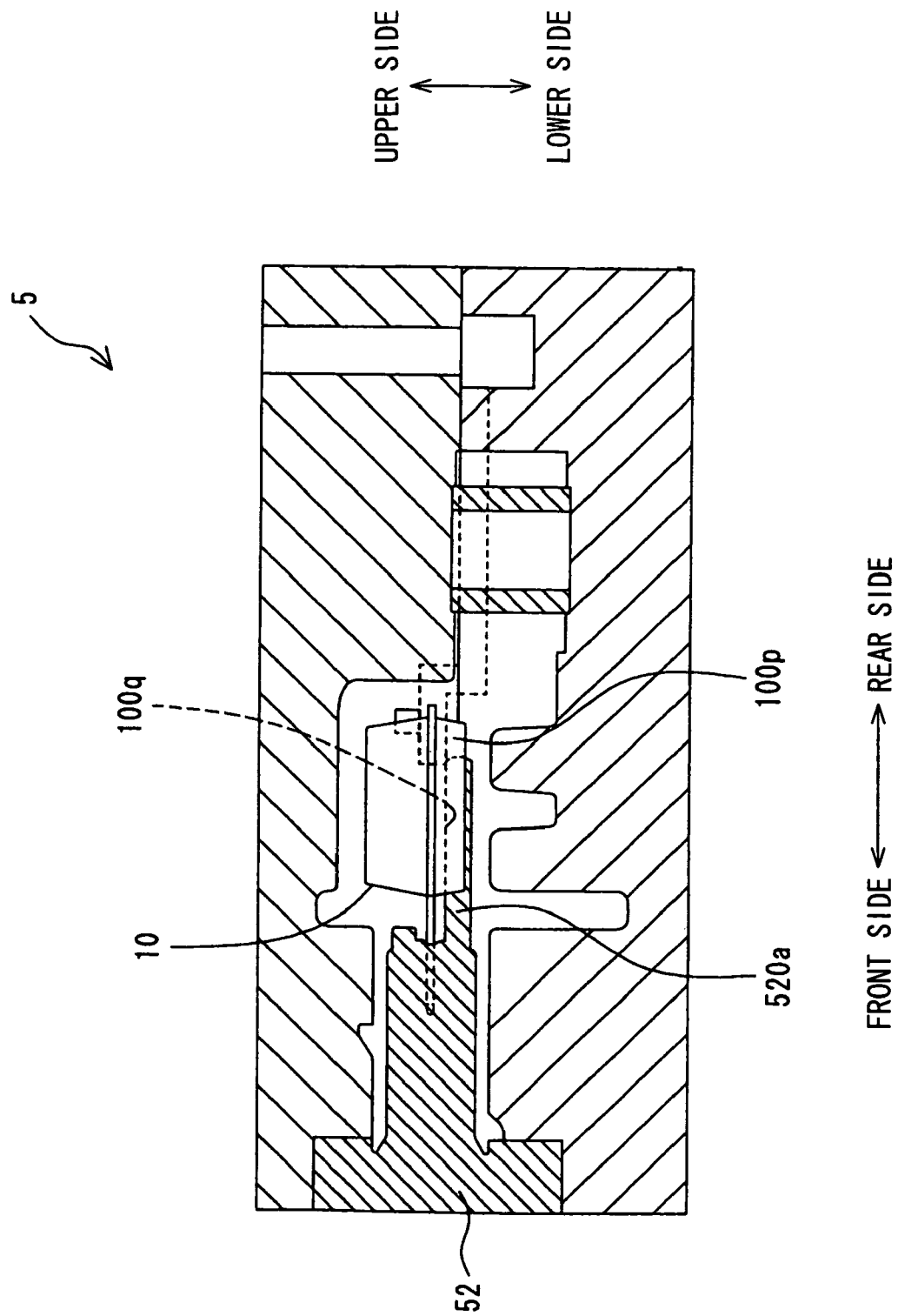
FIG. 13 is a cross-sectional view showing a molding tool according to a modification of the second embodiment.

In the molding tool 4, the holding parts 410a for holding the lower casing element 100o is disposed at the lower molding element 41, as an example. Alternatively, in a molding tool 5 shown in FIG. 13, holding parts 520a is provided at a rear portion of a slide core 52 to protrude to a rear side. In addition, a lower surface of a lower casing element 100p has grooves 100q that engage with the holding parts 520a, respectively. Also in the present case, the lower casing element 100p can be held by the holding parts 520a from a lower side thereof.

Third Embodiment

An acceleration sensor 6 according to a third aspect of the invention will be described with reference to FIGS. 14-20. In FIGS. 14-20, directions of a front side, a rear side, an upper side, a lower side, a right side, and a left side are shown as a matter of convenience for describing an exemplary structure of the acceleration sensor 6.

The acceleration sensor 6 includes an electronic circuit part 60 and a resin-molded case 61. The electronic circuit part 60 includes an acceleration sensor element 600a, capacitors 600b and 600c, wiring metal plates 600d-600i, connector terminals 600j-600m, an upper casing element 600n, and a lower casing element 600o. In the present embodiment, the acceleration sensor element 600a and the capacitors 600b and 600c correspond to electronic elements, the wiring metal plates 600d-600i correspond to the wiring plate, the upper casing element 600n corresponds to a first casing element, and the lower casing element 600o corresponds to a second casing element. The acceleration sensor element 600a, the capacitors 600b and 600c, the wiring metal plates 600d-600i, and the connector terminals 600j-600m are similar to the acceleration sensor element 100a, the capacitors 100b and 100c, the wiring metal plates 100d-100i, and the connector terminals 100j-100m according to the first embodiment, respectively.

Figure 16:
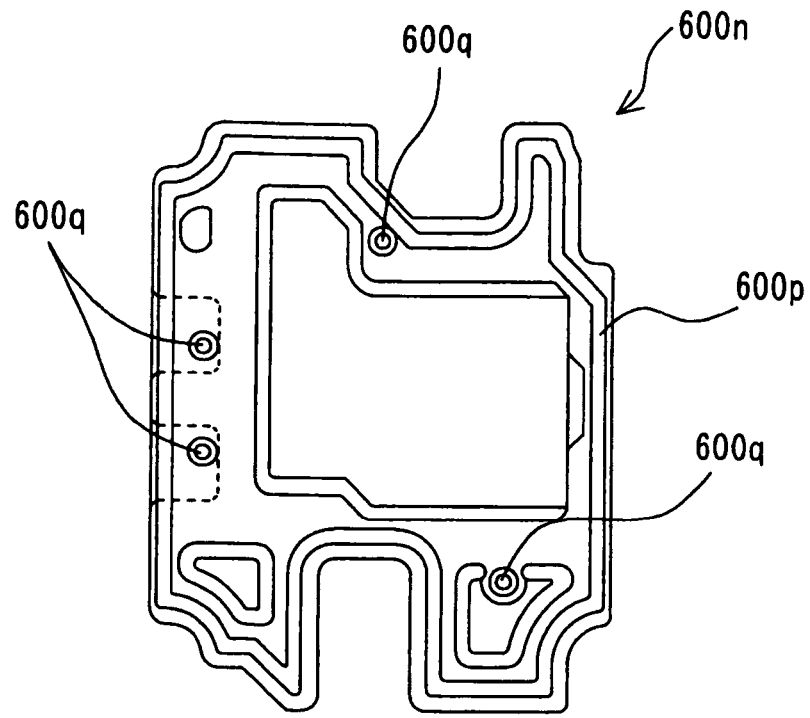
FIG. 16 is a bottom view showing an upper casing element.
Figure 17:
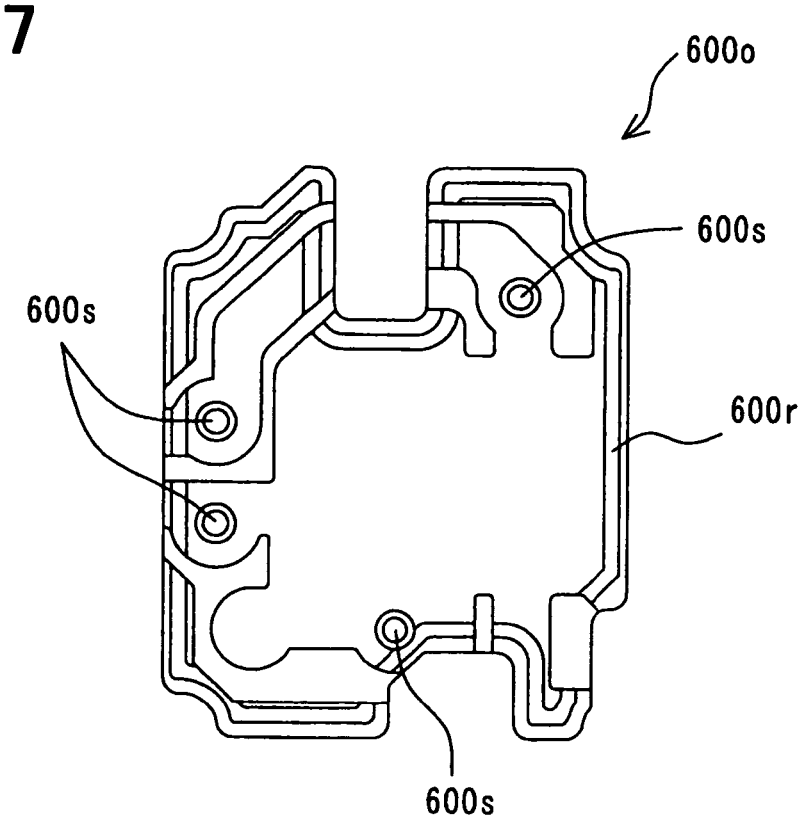
FIG. 17 is a top view showing a lower casing element.

The upper casing element 600n has an approximately tubular shape with a bottom surface. The upper casing element 600n covers upper surfaces of the wiring metal plates 100d-100i at which the acceleration sensor element 100a and the capacitors 100b and 100c are soldered. As shown in FIG. 16, the upper casing element 600n includes a wall portion 600p and protruding portions 600q.

When the upper casing element 600n is pushed toward the wiring metal plates 600d-600i, the wall portion 600p deforms, and thereby the wall portion 600p attaches closely to the wiring metal plates 600d-600i and the lower casing element 600o. The wall portion 600p is disposed along the whole circumference of an outer end of a lower surface of the upper casing element 600n and protrudes toward the wiring metal plates 600d-600i. A thickness of the wall portion 600p is determined in such a manner that a rigidity of the wall portion 600p is less than the other portion of the upper casing element 600n.

The protruding portions 600q are provided for fitting the upper casing element 600n to the lower casing element 600o. The protruding portions 600q protrude from the lower surface of the upper casing element 600n to the lower side.

Figure 14:
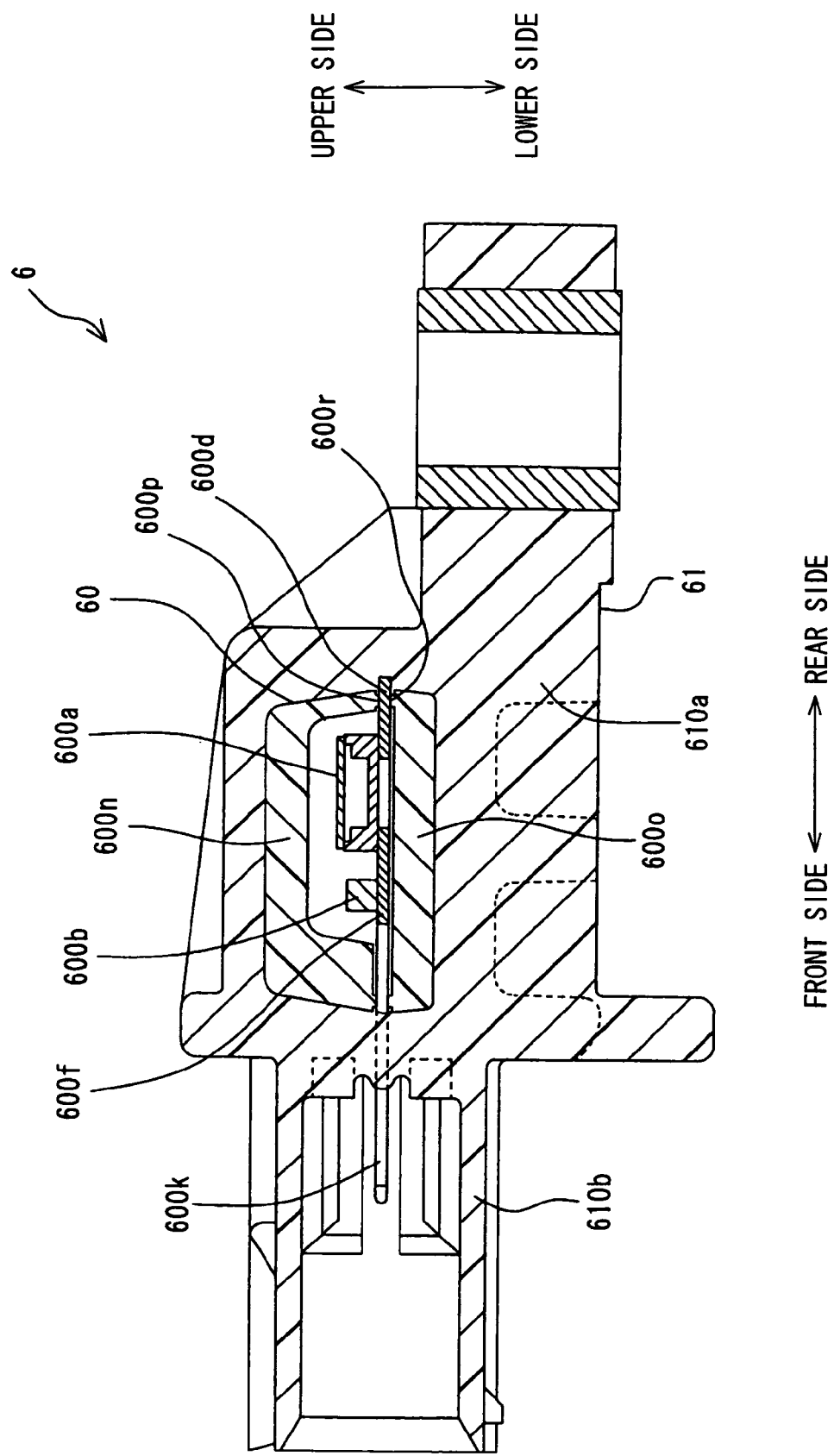
FIG. 14 is a cross-sectional view showing an acceleration sensor according to a third embodiment of the invention.
Figure 15:
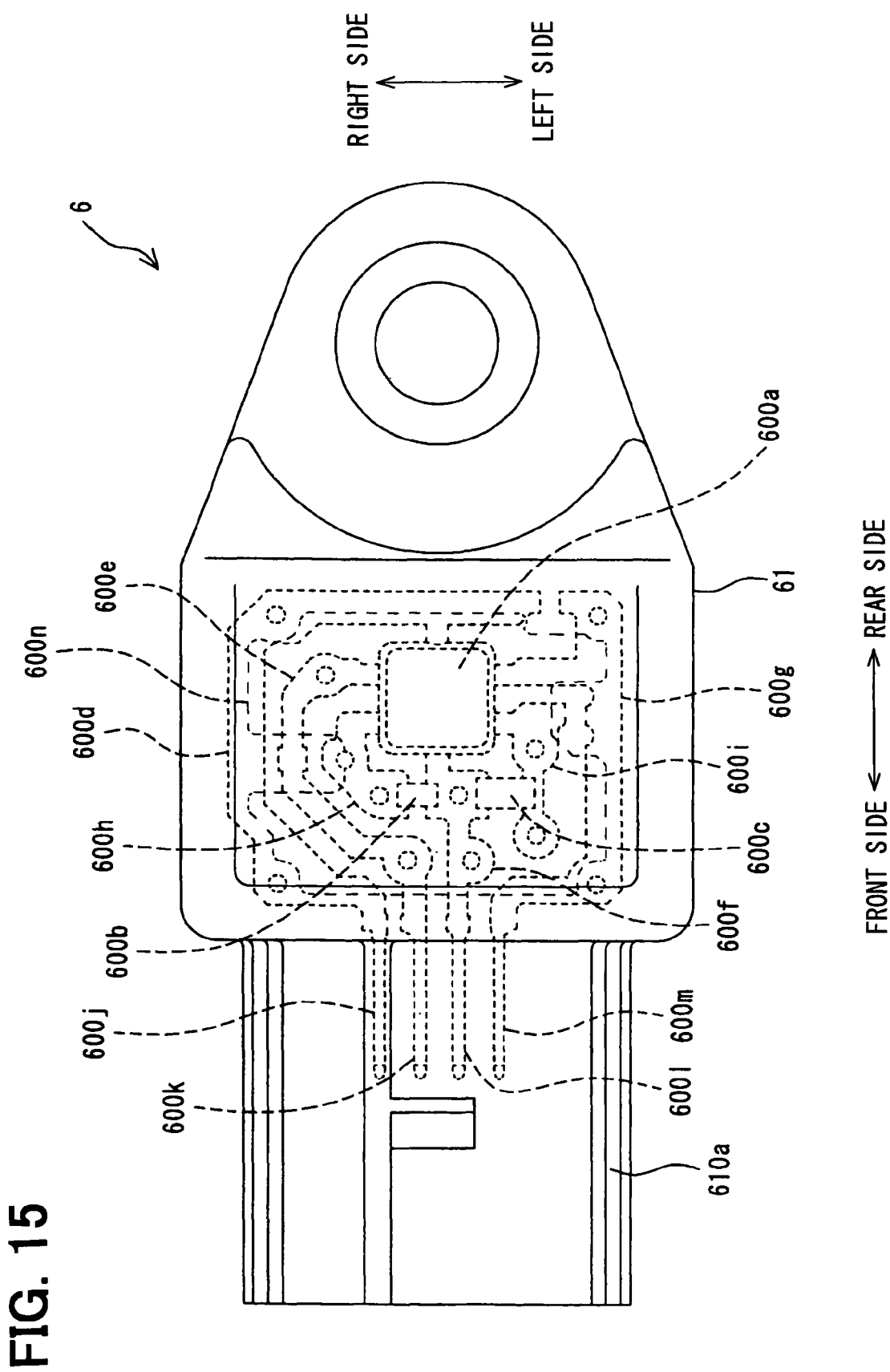
FIG. 15 is a top view showing the acceleration sensor according to the third embodiment.

As shown in FIGS. 14 and 15, the lower casing element 600o has an approximately tubular shape with a bottom surface. The lower casing element 600o covers lower sides of the wiring metal plates 600d-600i. The lower casing element 600o includes a wall portion 600r and fitting holes 600s.

When the lower casing element 600o is pushed toward the wiring metal plates 600d-600i, the wall portion 600r deforms, and thereby the wall portion 600r attaches closely to the wiring metal plates 600d-600i and the upper casing element 600n. The wall portion 600p is disposed along the whole circumference of an outer end of an upper surface of the lower casing element 600o and protrudes toward the wiring metal plates 600d-600i. A thickness of the wall portion 600r is determined in such a manner that a rigidity of the wall portion 600r is less than the other portion of the lower casing element 600o.

The protruding portions 600q of the upper casing element 600n are inserted into the fitting holes 600s of the lower casing element 600o, respectively. The fitting holes 600s are provided at the upper surface of the lower casing element 600o to extend to the lower side. The fitting holes 600s are provided at positions corresponding to the protruding portions 600q, respectively.

Figure 18:
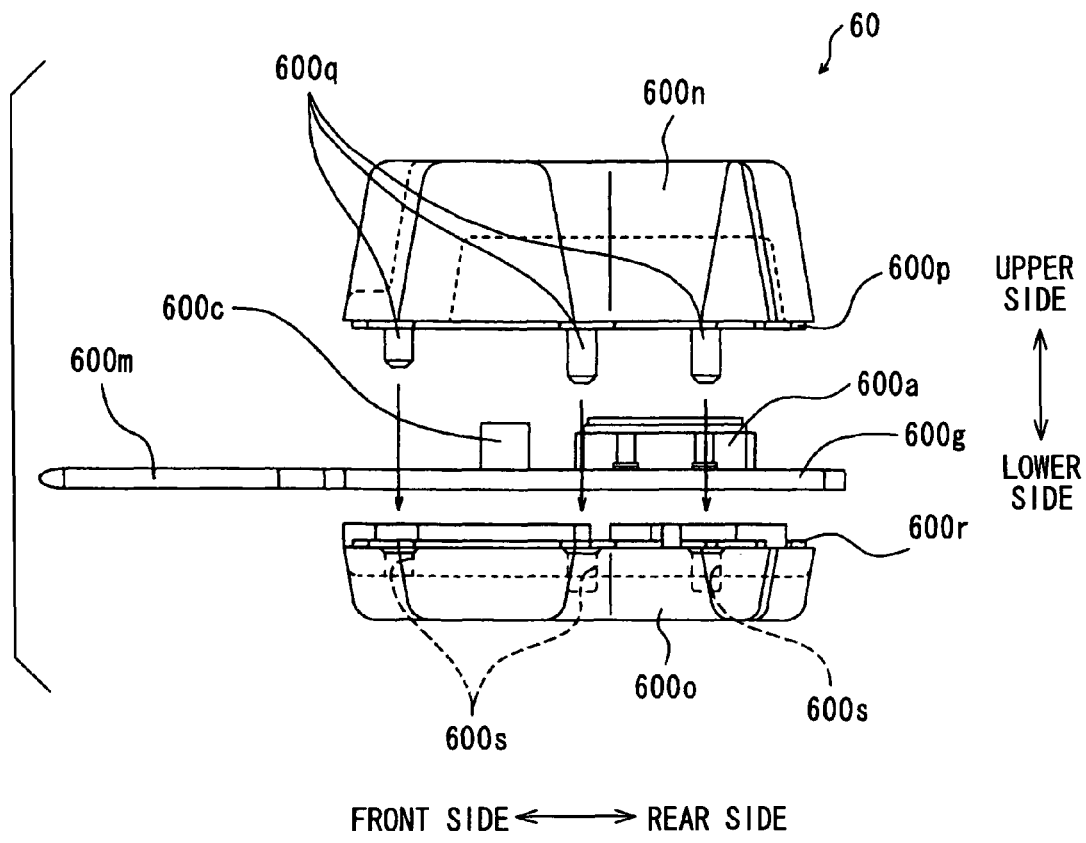
FIG. 18 is a side view showing an assembling method of the upper casing the lower casing, and wiring metal plates.
Figure 19:
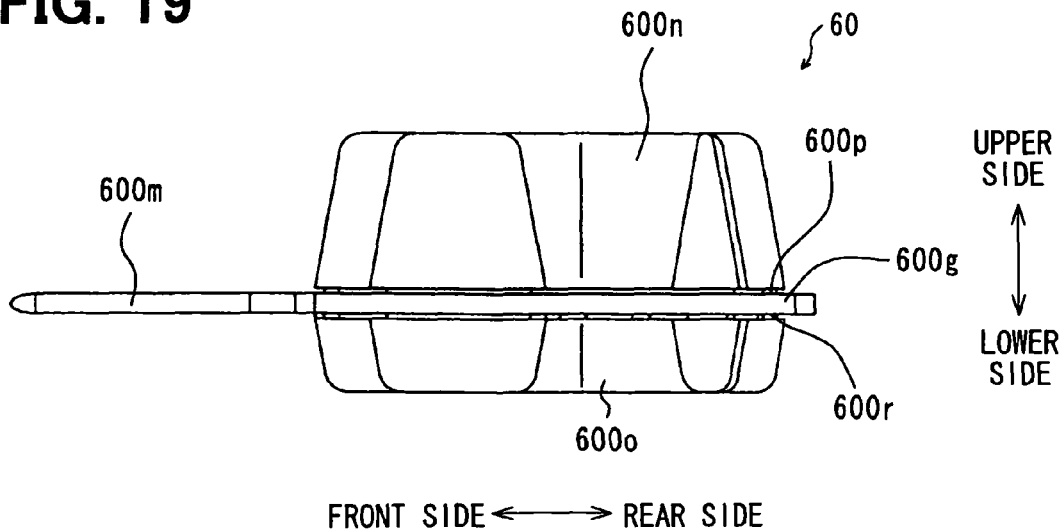
FIG. 19 is a side view showing an electronic circuit part.
Figure 20:
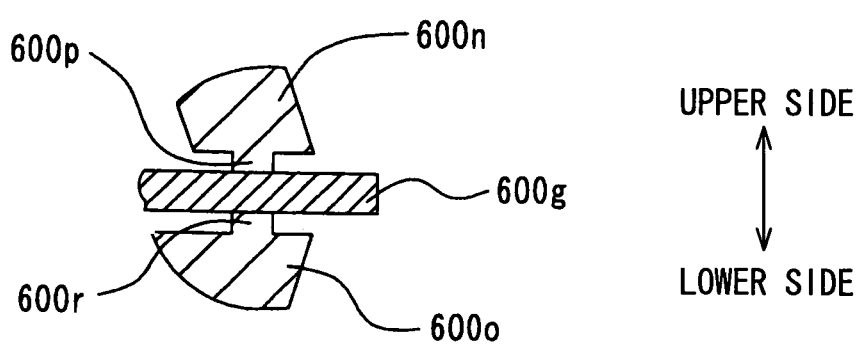
FIG. 20 is an enlarged cross-sectional view showing a rear end portion of the electronic circuit part.

As shown in FIG. 18, the upper casing element 600n houses the acceleration sensor element 600a and the capacitors 600b and 600c and covers the wiring metal plates 600d-600i from the upper side of the wiring metal plates 600d-600i. The lower casing element 600o covers the wiring metal plates 600d-600i from the lower side of the wiring metal plates 600d-600i. When the protruding portions 600q of the upper casing element 600n are fit into the fitting holes 600s of the lower casing element 600o, the upper casing element 600n and the lower casing element 600o are temporarily jointed with the wiring metal plates 100d-100i. Thereby, the electronic circuit part 60 is assembled, as shown in FIG. 19. When the electronic circuit part 60 is assembled, an end surface of the wall portion 600p of the upper casing element 600n and an end surface of the wall portion 600r respectively contact the upper surface and the lower surface of the wiring metal plate 600g, for example.

The electronic circuit part 60 is disposed in a case cavity of a molding tool. Then, melted resin is filled into the case cavity, and filling pressure is applied to the electronic circuit part 60. The upper casing element 600n includes the wall portion 600p and the lower casing element 600o includes the wall portion 600r. Thus, when the upper casing element 600n and the lower casing element 600o are pushed toward the wiring metal plates 600d-600i, the wall portions 600p and 600r deform and attach closely to the wiring metal plates 600d-600i. Thereby, even when the wiring metal plates 600d-600i deform due to the filling pressure, the upper casing element 600n and the lower casing element 600o can seal the acceleration sensor element 600a and the capacitors 600b and 600c. In addition, because the upper casing element 600n and the lower casing element 600o seal the acceleration sensor element 600a and the capacitors 600b and 600c by using the filling pressure of the melted resin, an additional process, for example, an adhesion process is not required.

The resin-molded case 61 for sealing the electronic circuit part 60 may be formed by the manufacturing method according to the first embodiment. Alternatively, the resin-molded case 61 may be formed by using one of the molding tool 2 shown in FIG. 3, the molding tool 4 shown in FIG. 8, and the molding tool 5 shown in FIG. 13.

Other Embodiments

Although the present invention has been fully described in connection with the preferred embodiments thereof with reference to the accompanying drawings, it is to be noted that various changes and modifications will become apparent to those skilled in the art.

In the above-described embodiments, the wiring metal plates 100d-100i are disposed for wiring the acceleration sensor element 100a and the capacitors 100b and 100c, and the wiring metal plates 600d-600i are disposed for wiring the acceleration sensor element 600a and the capacitors 600b and 600c, as examples. Alternatively, other member, for example, a printed wiring board may be disposed as a wiring plate for wiring an electronic element.

In the above-described embodiments, the upper casing elements 100n and 600n are separated from the lower casing elements 100o and 600o, respectively. Alternatively, one of the upper casing element 100n and the lower casing element 100o may be integrally formed with the wiring metal plates 100d-100i, and one of the upper casing element 600n and the lower casing element 600o may be integrally formed with the wiring metal plates 600d-600i. When the printed wiring board is used, one surface of the printed wiring board may function as one of the upper casing elements 100n and 600n and the lower casing elements 100o and 600o.

What is claimed is:

1. A method of manufacturing an electronic device including an electronic circuit part and a resin-molded case for sealing the electronic circuit part, the method comprising:
disposing an electronic element on a wiring plate that is electrically coupled with a connector terminal;
covering a first surface of the wiring plate with a first casing element and covering a second surface of the wiring plate with a second casing element to form the electronic circuit part;
disposing the electronic circuit part in a case cavity of a molding tool in such a manner that an end portion of the connector terminal protrudes to an outside of the case cavity; and
filling resin into the case cavity of the molding tool to form the resin-molded case while keeping a state where a first pressure that pushes the first casing element toward the wiring plate and that changes with time is substantially equal to a second pressure that pushes the second casing element toward the wiring plate and that changes with time; wherein
the first casing element and the second casing element are firmly attached to the wiring plate by the first pressure and the second pressure so that the electronic element is sealed between the first casing element and the second casing element;
at least one of the first casing element and the second casing element has a wall portion that is disposed along a whole circumference of an outer end of a surface of the one of the first casing element and the second casing element and that protrudes toward the wiring plate; and
the resin is filled into the case cavity so that the wall portion contacts the wiring plate and deforms when the first casing element and the second casing element are pushed toward the wiring plate by the filled resin.

2. The method according to claim 1, wherein
the first pressure and the second pressure are generated by the filled resin.

3. The method according to claim 2, wherein
the resin is filled into the case cavity while keeping a state where an area of the first casing element that is covered by the filled resin and that changes with time is substantially equal to an area of the second casing element that is covered by the filled resin and that changes with time.

4. The method according to claim 1, wherein:
the electronic circuit part is disposed in the case cavity of the molding tool in such a manner that the second casing element is held by a portion of the molding tool from an opposite side of the wiring plate;
the first pressure and a part of the second pressure are generated by the filled resin; and
the resin is filled into the case cavity while keeping a state where the part of second pressure is smaller than the first pressure.

5. The method according to claim 4, wherein
the other part of the second pressure is provided by the portion of the molding tool that holds the second casing element.

6. The method according to claim 4, wherein
the resin is filled into the case cavity while keeping a state where an area of the second casing element that is covered by the filled resin and that changes with time is smaller than an area of the first casing element that is covered by the filled resin and that changes with time.

7. The method according to claim 1, wherein
the wall portion has a first rigidity;
the other portion of the one of the first casing element and the second casing element has a second rigidity; and
the first rigidity is smaller than the second rigidity.

8. The method according to claim 1, wherein the resin fully covers an outer surface of at least one of the first casing element and the second casing element.

9. The method according to claim 1, wherein the first casing element includes an outer surface generally parallel to the wiring plate and the second casing element includes an outer surface generally parallel to the wiring plate, the resin, covering a portion of the outer surface of the first casing element and a portion of the outer surface of the second casing element.

10. A method of manufacturing an electronic device including an electronic circuit part and a resin-molded case for sealing the electronic circuit part, the method comprising:

disposing an electronic element on a wiring plate that is electrically coupled with a connector terminal;

covering a first surface of the wiring plate with a first casing element and covering a second surface of the wiring plate with a second casing element to form the electronic circuit part, wherein at least one of the first casing element and the second casing element has a wall portion that is disposed along a whole circumference of an outer end of a surface of the one of the first casing element and the second casing element and that protrudes toward the wiring plate;

disposing the electronic circuit part in a case cavity of a molding tool in such a manner that an end portion of the connector terminal protrudes to an outside of the case cavity; and filling resin into the case cavity to form the resin-mold case, wherein the first casing element and the second casing element are pushed toward and firmly attached to the wiring plate by the filled resin and the wall portion contacts the wiring plate and deforms so that the electronic element is sealed between the first casing element and the second casing element.

11. The method according to claim 10, wherein:

the wall portion has a first rigidity;

the other portion of the one of the first casing element and the second casing element has a second rigidity; and the first rigidity is smaller than the second rigidity.

12. The method according to claim 10, wherein the resin fully covers an outer surface of at least one of the first casing element and the second casing element.

13. The method according to claim 10, wherein the first casing element includes an outer surface generally parallel to the wiring plate and the second casing element includes an outer surface generally parallel to the wiring plate, the resin, covering a portion of the outer surface of the first casing element and a portion of the outer surface of the second casing element.

* * * * *